United States Patent
Li (10) Patent No.: US 7,952,504 B2
(45) Date of Patent: May 31, 2011

(54) GAIN CONTROL METHOD AND ELECTRONIC APPARATUS CAPABLE OF GAIN CONTROL

(75) Inventor: Kuan-I Li, Kaohsiung (TW)

(73) Assignee: Mediatek Inc., Hsin-Chu (TW)

( * ) Notice: Subject to any disclaimer, the term of this patent is extended or adjusted under 35 U.S.C. 154(b) by 61 days.

(21) Appl. No.: 12/487,755

(22) Filed: Jun. 19, 2009

(65) Prior Publication Data
US 2010/0321219 A1    Dec. 23, 2010

(51) Int. Cl.
*H03M 1/00*    (2006.01)

(52) U.S. Cl. ............... 341/139; 341/50; 341/51

(58) Field of Classification Search ............ 341/139, 341/50, 51
See application file for complete search history.

(56) References Cited

U.S. PATENT DOCUMENTS

| | | | | |
|---|---|---|---|---|
| 4,546,342 A | * | 10/1985 | Weaver et al. | 341/51 |
| 6,234,294 B1 | * | 5/2001 | Defeo et al. | 194/207 |
| 2003/0228117 A1 | * | 12/2003 | Truitt et al. | 385/122 |
| 2007/0071339 A1 | * | 3/2007 | Yang et al. | 382/240 |
| 2008/0298756 A1 | * | 12/2008 | Truitt et al. | 385/122 |

OTHER PUBLICATIONS

"Performance of the Adaptive A/D Converter in Combined CW and Gaussian Interference" Amaroso et al.; IEEE Transactions on Communications, vol. Com-34, No. 3, Mar. 1986, pp. 209-213.

"Adaptive ADS Design for Neuro-Prosthetic Interfaces: Base ADS Cell" O'Driscoll et al.; Proceedings of the 2005 European Conference on Circuit Theory and Design, pp. 301-304, Cork, Ireland, Aug. 2005.

"Adaptive A/D Converter to Suppress CW Interference in DSPN Spread-Spectrum Communications" Amaroso; IEE Transactions on Communications, No. Com-31, No. 10, Oct. 1983, pp. 1117-1123.

* cited by examiner

*Primary Examiner* — Jean B Jeanglaude
(74) *Attorney, Agent, or Firm* — Thomas|Kayden (57) ABSTRACT

A gain control method is provided. In one embodiment, an amplifier amplifies a first signal according to a gain to obtain a second signal, and a converter converts the second signal to a digital signal. First, the gain is sequentially set to a plurality of gain values. A plurality of entropy values of the digital signal corresponding to the gain values is then calculated. A picked entropy value of the entropy values is then determined. The gain value corresponding to the picked entropy value is then determined as a picked gain value. Finally, the gain is set to the picked gain value for amplifying the first signal.

29 Claims, 10 Drawing Sheets

FIG. 9B

GAIN CONTROL METHOD AND ELECTRONIC APPARATUS CAPABLE OF GAIN CONTROL

BACKGROUND OF THE INVENTION

1. Field of the Invention

The invention relates to gain control or the quantization method for input signals of analog-to-digital conversion or digital-to-digital conversion circuits or process.

2. Description of the Related Art

Analog-to-digital converters (ADC) are circuit components for converting analog signals to digital signals. Analog processing circuits for processing analog signals have complicated circuit structures and therefore higher manufacturing costs. On the contrary, digital processing circuits, such as widely used microprocessors and digital signal processors, can perform complicated signal processing with lower circuit cost. Digital processing circuits are therefore more popular than analog processing circuits, and analog input signals of electronic apparatus are converted into digital signals to be processed by digital processing circuits. Thus, analog-to-digital converters are requisite circuit components of electronic apparatus.

A working range of an analog-to-digital converter is the convertible input voltage variation range thereof. If the voltage of an analog input signal exceeds the working range of an analog-to-digital converter, the digital output signal may suffer from a waveform distortion, or signal-to-noise ratio (SNR) degradation. Because the voltage variation range of an analog input signal does not always coincide with the working range of an analog-to-digital converter, the amplitude of the analog input signal must be carefully adjusted before the analog input signal is fed into the analog-to-digital converter. Thus, an automatic gain control (AGC) module is added to determine a gain of the analog input signal, and an amplifier is used to amplify the analog input signal according to the gain to obtain an amplified analog signal with a voltage variation range coinciding with the working range of the analog-to-digital converter. After the analog-to-digital converter converts the amplified analog signal to a digital signal, the digital signal therefore has a higher signal-to-noise ratio.

Figure 1:
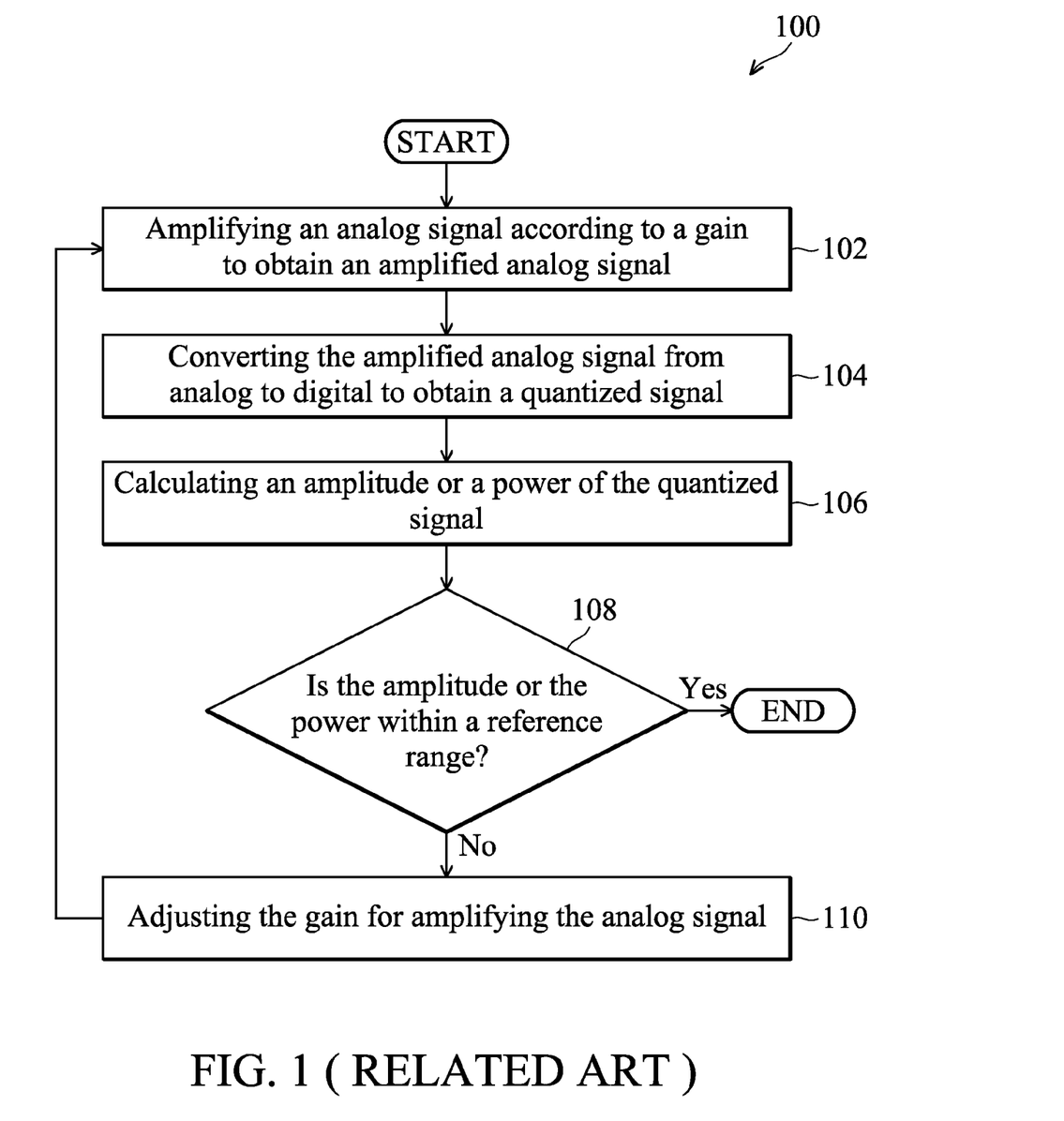
FIG. 1 is a flowchart of a conventional gain control method for an analog input signal of an analog-to-digital converter.

Referring to FIG. 1, a flowchart of a conventional gain control method 100 for an analog input signal of an analog-to-digital converter is shown. A conventional gain control module determines the gain for amplifying an analog input signal of an analog-to-digital converter according to the method 100. First, an amplifier amplifies an analog signal according to a gain determined by the gain control module to obtain an amplified analog signal (step 102). The amplified analog signal is then fed to an analog-to-digital converter, and the analog-to-digital converter converts the amplified analog signal from analog to digital to obtain a quantized signal (step 104). The gain control module then estimates the amplitude or power of the quantized signal and compares the value with a reference value (step 106). In some embodiment, the gain control schemes are based on PAPR (peak to average power ratio), RSSI (received signal strength indicator) or the signal amplitude distribution. The gain control module then determines whether the quantized signal amplitude is within the reference range (step 108). If so, the gain for amplifying the analog signal requires no adjustment. Otherwise, the gain control module adjusts the gain for amplifying the analog signal (step 110).

In the design of automatic gain control algorithm, the basic performance criterion of an AGC algorithm is to minimize the quantization noise of the signal after analog-to-digital conversion:

$$N_Q = \int_{-\infty}^{\infty} (x - x_Q)^2 p(x) dx; \quad (1)$$

wherein $N_Q$ is the quantization noise power, x is the amplified analog signal, $x_Q$ is the digital signal, and p(x) is the hypothetic signal distribution. The signal distribution p(x) indicates a probability of the amplitude of the amplified analog signal. For example, the hypothetic input signal distribution of a GNSS system is a Gaussian distribution.

Figure 2:
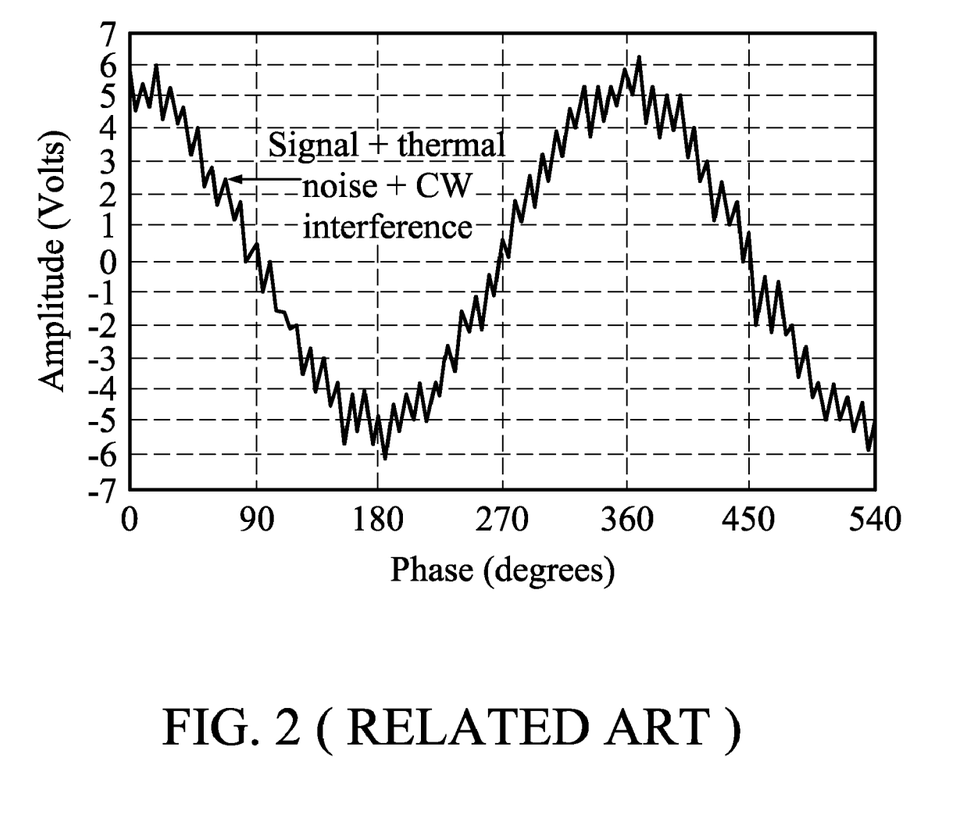
FIG. 2 is a schematic diagram of a signal comprising interference and noise.

When a signal is transmitted from a transmitter to a receiver in a communication system, the signal suffers from interference and noise in the transmission path between the transmitter and the receiver. The receiver therefore receives an input signal comprising interference and noise. Referring to FIG. 2, a schematic diagram of a signal comprising interference and noise is shown. The interference components of the received signal are referred to as jamming components. The jamming component greatly changes the voltage variation range of the received signal and alters the signal distribution of the received signal. As shown in FIG. 2, a sinusoidal wave signal component oscillating between −6 volts and +6 volts is the jamming component.

Because a signal distribution of the jamming component cannot be predicted in advance, the actual jamming environments may vary a lot with different interference types or power, which can not be modeled. If the AGC behavior mode is not properly designed for the changing environment, the AGC gain control is not optimized. The analog input signal property and CN0 are seriously degraded at the ADC quantization stage. The digital signal output by the analog-to-digital converter therefore has low signal-to-noise ratio, degrading system performance. For example, the signal-to-noise ratio may be lower than that corresponding to an optimal gain by 10~15 dB. Thus, a method for determining a gain for amplifying an analog input signal of an analog-to-digital converter under all signal input environment to increase a signal-to-noise ratio of a digital output signal is therefore required.

BRIEF SUMMARY OF THE INVENTION

A gain control method or a quantization method for input signals of analog-to-digital conversion or digital-to-digital conversion is provided. In one embodiment, an amplifier amplifies a first signal according to a gain to obtain a second signal, and a converter converts the second signal to obtain a digital signal. First, the gain is sequentially set to a plurality of gain values. A plurality of entropy values of the digital signal distribution corresponding to the gain values is then calculated. A picked entropy value of the entropy values is then determined. The gain value corresponding to the picked entropy value is then determined as a picked gain value. Finally, the gain is set to the picked gain value for amplifying the first signal.

An electronic apparatus is also provided. In one embodiment, the electronic apparatus comprises an amplifier, a converter, an entropy calculation module, and a gain control module. The amplifier amplifies a first signal according to a gain to obtain a second signal. The analog-to-digital converter converts the second signal to a digital signal. The entropy calculation module calculates an entropy value of the digital signal. The gain control module performs a training procedure to sequentially set the gain to a plurality of gain values, sequentially record the entropy values of the distribution of the quantized signal corresponding to the gain values, determine a picked entropy value of the entropy values, determine the gain value corresponding to the picked entropy value as an picked gain value, and set the gain to the picked gain value for amplifying the first signal.

A gain control method is also provided. In one embodiment, an amplifier amplifies a first signal according to a gain to obtain a second signal, and a converter converts the second signal to a digital signal. First, a training procedure is performed to determine a picked gain value for amplifying the first signal according to entropy values of the digital signal. The gain of the amplifier is then set to the picked gain value.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 3:
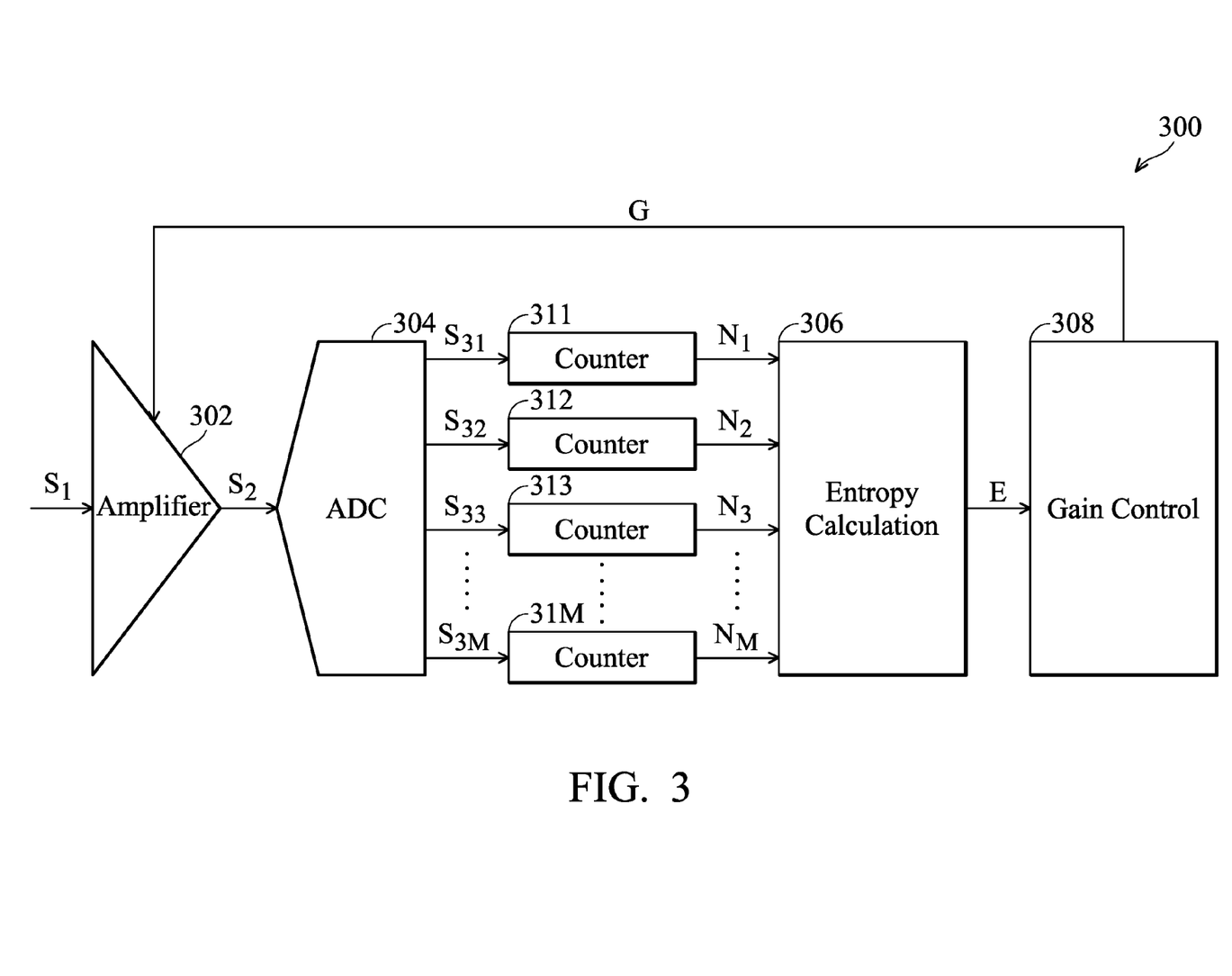
FIG. 3 is a block diagram of an electronic apparatus capable of gain control according to the invention.

Referring to FIG. 3, a block diagram of an electronic apparatus 300 capable of gain control according to the invention is shown. In one embodiment, the electronic apparatus 300 comprises an amplifier 302, an analog-to-digital converter 304, an entropy calculation module 306, and a gain control module 308. The gain control module 308 determines a gain G. The amplifier 302 then amplifies an analog signal $S_1$ according to the gain G to obtain an amplified analog signal $S_2$. The analog-to-digital converter 304 then converts the amplified analog signal $S_2$ to a digital signal $S_3$. The entropy calculation module 306 then calculates an entropy value E of the digital signal distribution $S_3$. The gain control module 308 then determines the gain G for signal amplification according to the entropy value E determined by the entropy calculation module 306. In one embodiment, the gain control module 308 adjusts the gain G for amplifying the analog signal $S_1$ to increase the entropy value E of the digital signal $S_3$, and the gain control module 308 determines the gain value G corresponding to the maximum of the entropy value E (picked entropy value) to be an optimal gain value (picked gain value). In one embodiment, the distribution counters, entropy calculation module, or gain control module can be implemented as a process in a processor.

The analog-to-digital converter 304 is assumed to comprise M steps or digital levels. In other words, the analog-to-digital converter 304 converts the amplified analog signal into the digital signal $S_3$ with M kinds of digital values $S_{31}$~$S_{3M}$. In one embodiment, the electronic apparatus 300 further comprises a plurality of counters 311~31M coupled between the analog-to-digital converter 304 and the entropy calculation module 306, and each of the counters 311~31M corresponds to one of the digital values $S_{31}$~$S_{3M}$. The counters 311~31M then respectively count appearance frequencies $N_1$~$N_M$ of the digital values $S_{31}$~$S_{3M}$ in the digital signal $S_3$ output by the analog-to-digital converter 304. The entropy calculation module 306 then calculates the entropy value E of the digital signal $S_3$ according to the appearance frequencies $N_1$~$N_M$ of the digital values $S_{31}$~$S_{3M}$ in the digital signal $S_3$. In one embodiment, entropy calculation can be done by a processor instead of by the entropy calculation module 306.

In one embodiment, the entropy calculation module 306 calculates the entropy value E according to the any entropy definition or any entropy estimation method such as:

$$\text{Shannon Entropy } E = -\sum_{i=1}^{M} p_i \times \log p_i; \quad (2)$$

$$\text{Renyi Entropy } E = -\frac{1}{1-\alpha} \log \sum_{i=1}^{M} p_i^{\alpha}; \quad (3)$$

wherein E is the entropy value, M is the number of the steps, i is an index of the digital values $S_{31}$~$S_{3M}$, $p_i$ is an appearance probability of the digital value $S_{31}$~$S_{3M}$ corresponding to the ith index, and $\alpha$ is a natural number equal to or greater than 2. In other words, the entropy calculation module 306 first sums the appearance frequencies $N_1$~$N_M$ to obtain a total frequency $N_{total}$, and then divides the appearance frequencies $N_1$~$N_M$ by the total frequency $N_{total}$ to obtain the appearance probabilities $p_i$ of the digital values $S_{31}$~$S_{3M}$ in the digital signal $S_3$. The entropy value E is then derived from the appearance probabilities $p_i$ of the digital values $S_{31}$~$S_{3M}$ according to the algorithm (2). In one embodiment, each counter corresponds to a cluster of digital values.

Calculation of the entropy value requires neither the signal distribution model nor the prior information about the environment. The entropy calculation module 306 therefore can obtain a precise entropy value E, and the gain control module 308 can properly determine the gain G for amplifying the analog signal $S_1$. Because the analog-to-digital converter 304 receives a properly amplified input signal $S_2$, the analog-to-digital converter 304 can generate the digital signal $S_3$ with a high signal-to-noise ratio, thus improving system performance.

Figure 4:
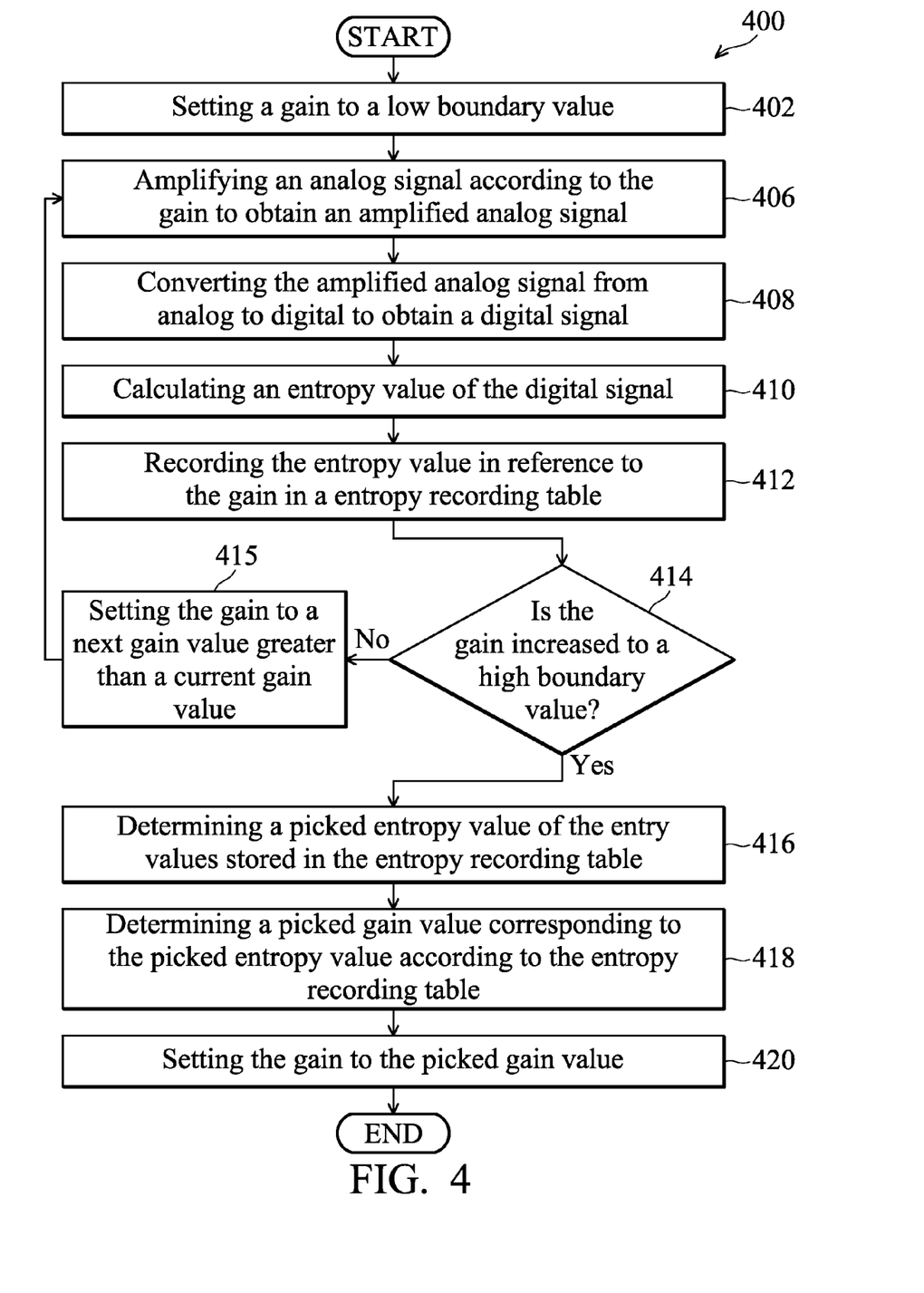
FIG. 4 is a flowchart of a method for determining an optimal gain for amplifying an analog input signal of an analog-to-digital converter according to the invention.

Referring to FIG. 4, a flowchart of a method 400 for determining an optimal gain for amplifying an analog input signal of an analog-to-digital converter according to the invention is shown. The gain control module 308 determines the optimal gain value G according to the method 400. The method 400 is also referred to a training procedure. First, the gain control module 308 sets the gain G to a low boundary value (step 402). The amplifier 302 then amplifies an analog signal $S_1$ according to the gain G to obtain an amplified analog signal $S_2$ (step 406). The analog-to-digital converter 304 then converts the amplified analog signal $S_2$ from analog to digital to obtain a digital signal $S_3$ (step 408). The entropy calculation module 306 then calculates an entropy value E of the digital signal $S_3$ (step 410). The gain control module 308 then records the entropy value E in reference to the gain G in an entropy recording table (step 412). When the gain has not been increased to a high boundary value (step 414), the gain control module 308 sets the gain G to a next gain value higher than a current gain value (step 415), and the electronic apparatus 300 operates according to steps 406~414 again with the new gain G.

The loop of steps 406~415 continues until the gain G is increased to a high boundary value (step 414). In each iteration of the loop, the gain control module 308 records an entropy value E corresponding to a gain value G in the entropy recording table (step 412). After the gain G is increased to the high boundary value, the entropy recording table store a plurality of entropy values E corresponding to a plurality of gain values G. The gain control module 308 then determines a picked entropy value of the entry values stored in the entropy recording table (step 416). The picked entropy value may be the maximum of the entropy values in the table or an interpolation value of the adjacent values near the maximum value. The gain control module 308 then finds a gain value corresponding to the picked entropy value in the entropy recording table, and determines the gain value corresponding to the picked entropy value to be a picked gain value (step 418). Finally, the gain control module 308 sets the gain to the picked gain value (step 420). The picked gain value should be the optimal gain value in the table. Thus, when the gain G is set to the optimal gain value, the analog-to-digital converter 304 generates a digital signal $S_3$ with a maximum entropy value. The digital signal $S_3$ with a maximum entropy value also has a maximum signal-to-noise ratio.

The signals $S_1$ and $S_2$ shown in FIG. 3 are analog signals and the converter 304 is an analog-to-digital converter. In another embodiment, the signals $S_1$ and $S_2$ are digital signals, and the analog-to-digital converter 304 is a digital converter which converts the signal $S_2$ with a greater bit number to the digital signal $S_3$ with a less bit number. Because the signal $S_3$ generated by the analog-to-digital converter 304 comprises quantization noise, the gain control method 400 can still applied to determine an optimal gain for amplifying the digital input signal $S_2$ of the analog-to-digital converter 304.

Figure 5A:
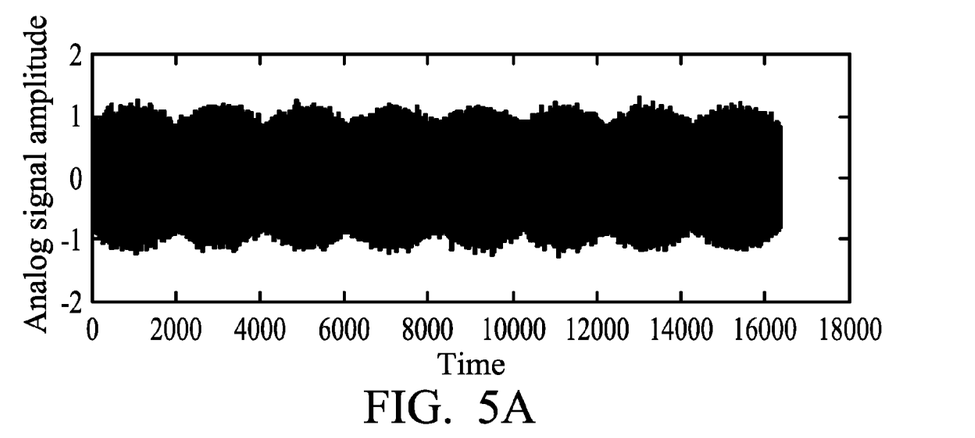
FIGS. 5A and 7A respectively show analog signals comprising white noises, GNSS signals, and continuous wave components.
Figure 5B:
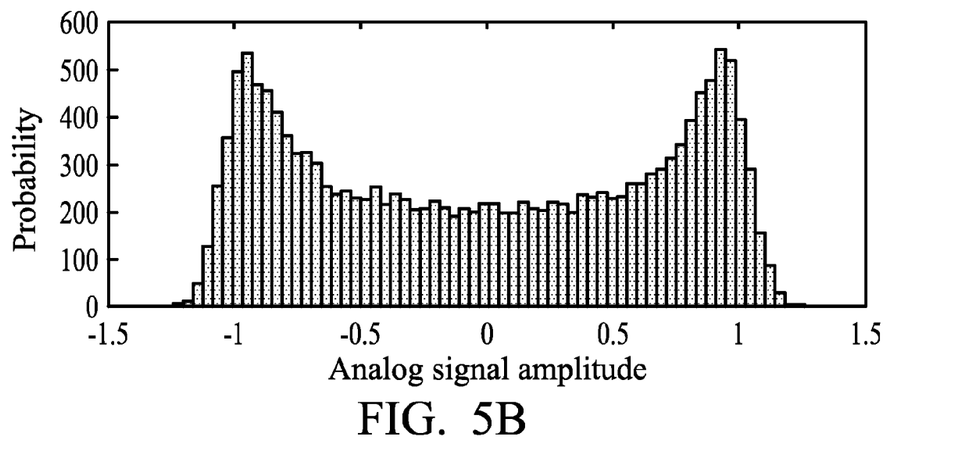
FIGS. 5B and 7B show signal amplitude distributions of the analog signals shown in FIGS. 5A and 7A.
Figure 5C:
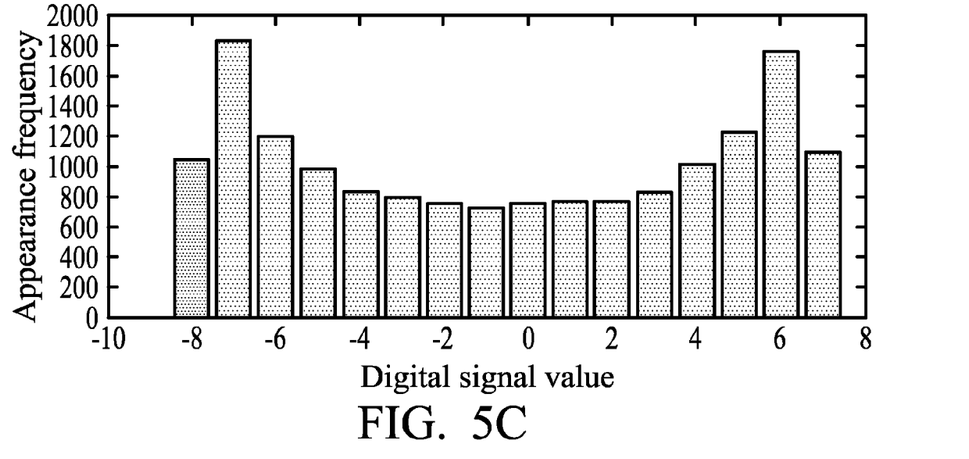
FIGS. 5C and 7C show signal distributions of digital signals with maximum entropy values.

Referring to FIG. 5A, an analog signal comprising a white noise with power of −110 dBm, GNSS signal with power of −130 dBm, and continuous wave (CW) component with a power of −90 dBm is shown. A signal amplitude distribution of the analog signal shown in FIG. 5A is shown in FIG. 5B. The electronic apparatus 300 then performs the training procedure of method 400 shown in FIG. 4 to determine an optimal gain value corresponding to a maximum entropy. After the gain G is set to the optimal gain value determined according to the method 400, the analog-to-digital converter 304 generates a digital signal $S_3$ with the maximum entropy value. Referring to FIG. 5C, a signal distribution of the digital signal after a 4-bit ADC with the maximum entropy value is shown. Because the digital signal $S_3$ with a maximum entropy value also has a maximum signal-to-noise ratio, indicating a minimal level of signal distortion due to analog-to-digital conversion.

Figure 6A:
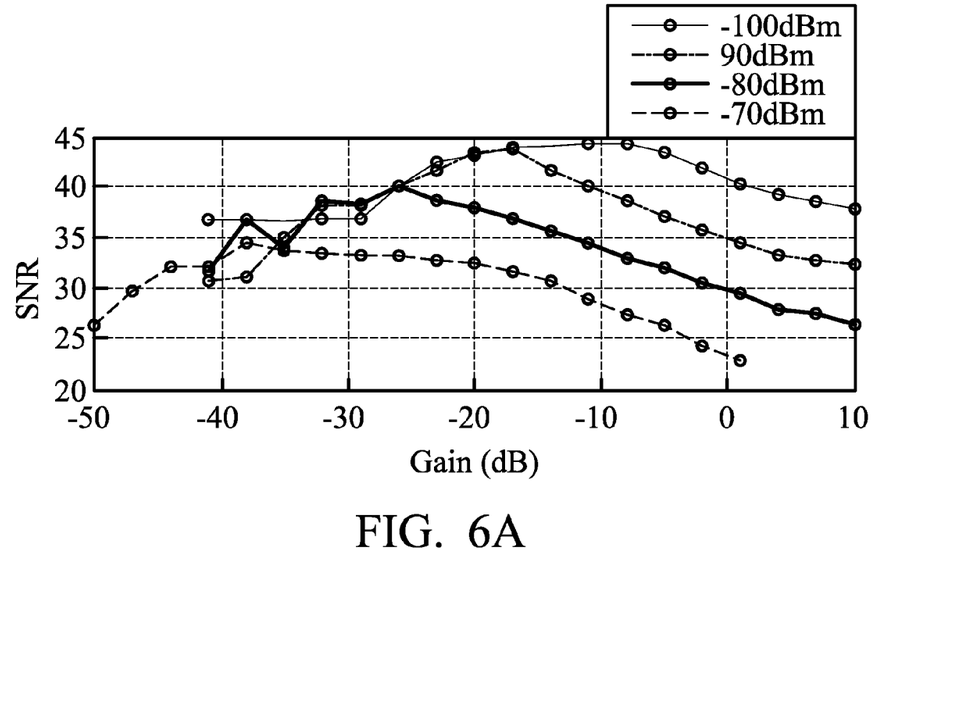
FIGS. 6A and 8A are schematic diagrams of a corresponding relationship between signal-to-noise ratios and gain values.
Figure 6B:
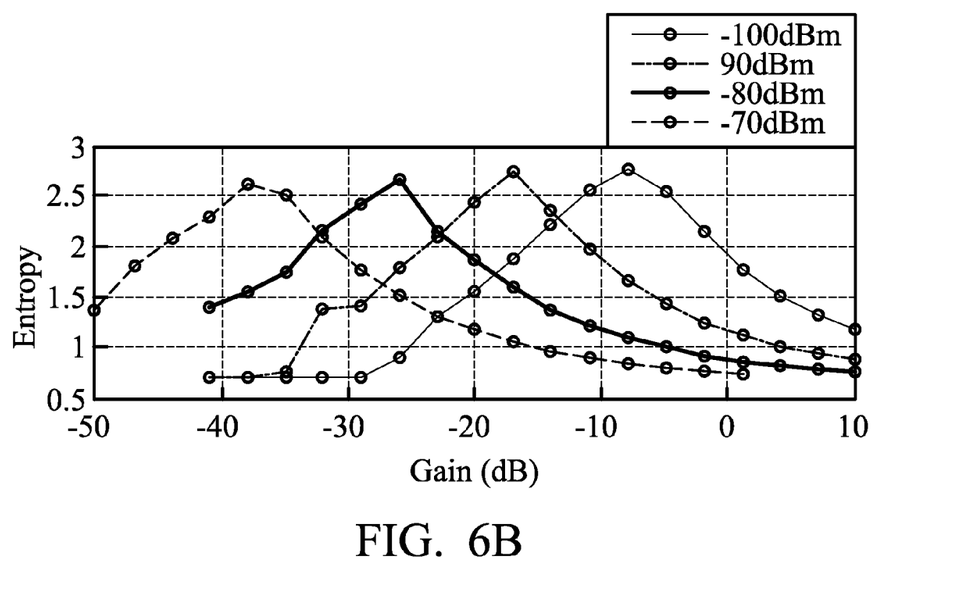
FIGS. 6B and 8B are schematic diagrams of a corresponding relationship between entropy values and gain values.

Referring to FIG. 6A, a schematic diagram of a corresponding relationship between signal-to-noise ratios and gain values is shown. Four curves in FIG. 6A respectively correspond to analog signals comprising white noise with power of −110 dBm, GNSS signal with power of −130 dBm, and continuous wave components with powers of −70, −80, −90, and −100 dBm. For each curve, the gain G for amplifying the analog signal is gradually adjusted from −50 dB to 10 dB, and the signal-to-noise ratio SNR varies with the adjusted gain value. The optimal gain value is the gain value corresponding to the maximum signal-to-noise ratio. Referring to FIG. 6B, a schematic diagram of a corresponding relationship between entropy values and gain values is shown. Four curves in FIG. 6B respectively correspond to analog signals comprising jamming components with powers of −70, −80, −90, and −100 dBm. For each curve, the gain G for amplifying the analog signal is gradually adjusted from −50 dB to 10 dB, and the entropy value varies with the adjusted gain value. The optimal gain value is the gain value corresponding to the maximum entropy value. Comparing the FIG. 6A with FIG. 6B, the optimal gain value corresponding to the maximum signal-to-noise ratio is equal to the optimal gain value corresponding to the maximum entropy value. The optimal gain value determined according to the method 400 therefore generates a digital signal $S_3$ with a maximum signal-to-noise ratio.

Figure 7A:
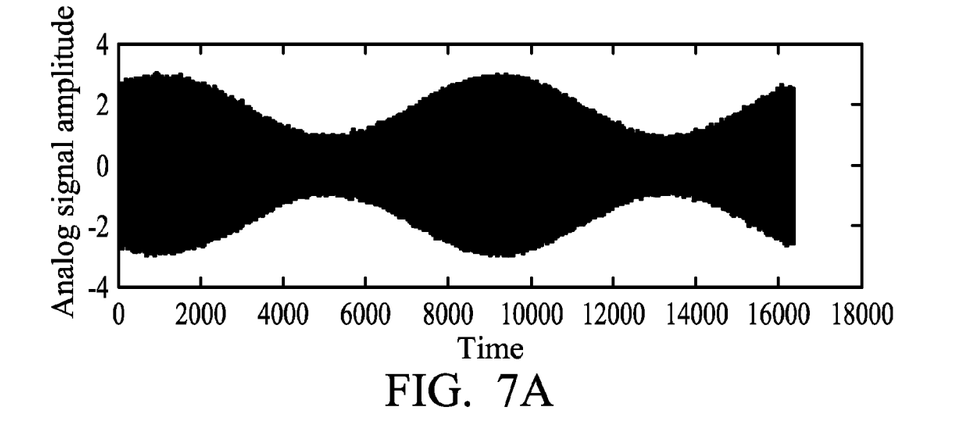
Figure 7B:
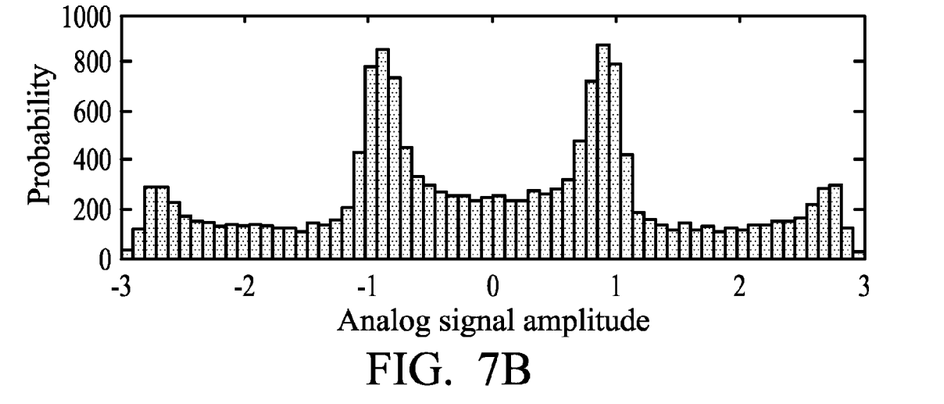
Figure 7C:
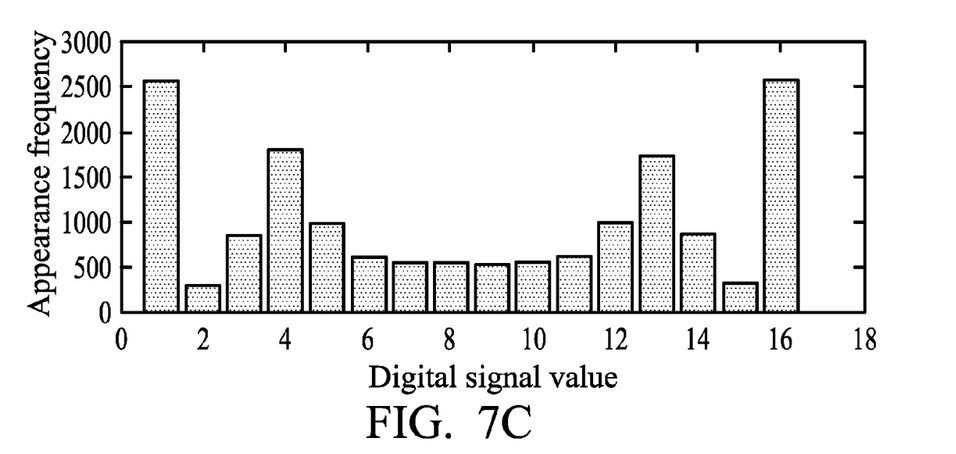

Referring to FIG. 7A, an analog signal comprising white noise with power of −110 dBm, GNSS signal with power of −130 dBm, and two continuous wave components with frequencies of 4 MHz and 400 MHz is shown. A signal distribution of the analog signal shown in FIG. 7A is shown in FIG. 7B. The electronic apparatus 300 then performs the training procedure of method 400 shown in FIG. 4 to determine an optimal gain value corresponding to a maximum entropy. After the gain G is set to the optimal gain value determined according to the method 400, the analog-to-digital converter 304 generates a digital signal $S_3$ with the maximum entropy value. Referring to FIG. 7C, a signal distribution of the digital signal with the maximum entropy value is shown. Because the digital signal $S_3$ with a maximum entropy value also has a maximum signal-to-noise ratio, indicating a minimal level of signal distortion due to analog-to-digital conversion.

Figure 8A:
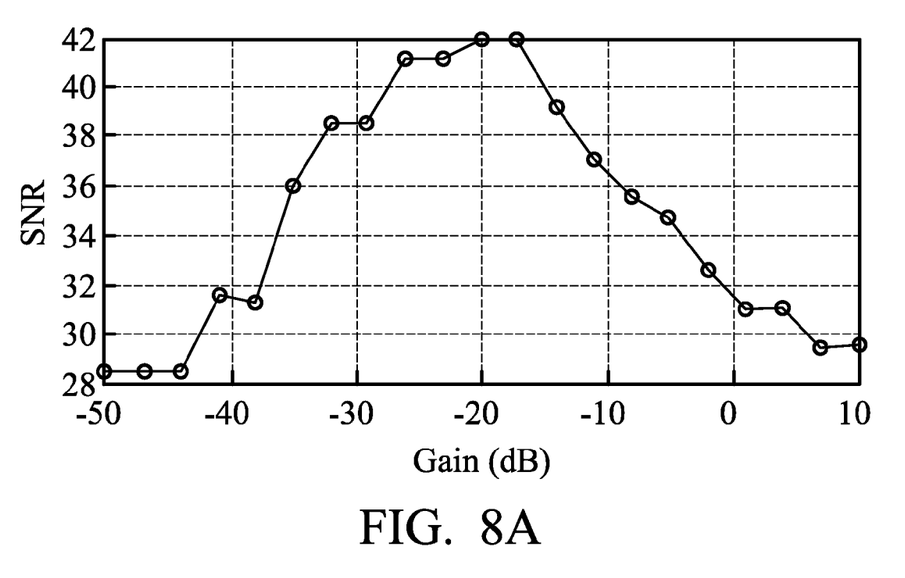
Figure 8B:
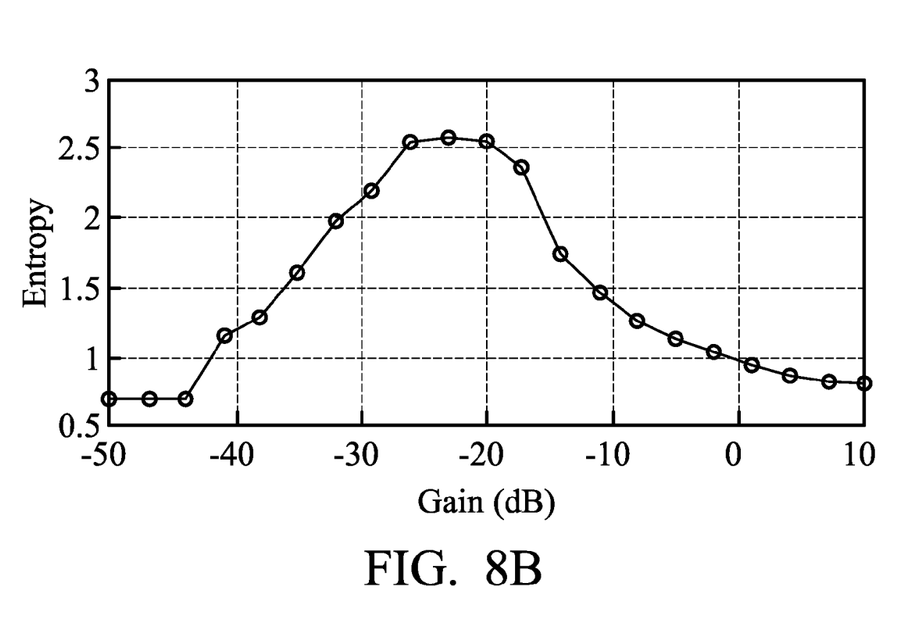

Referring to FIG. 8A, a schematic diagram of a corresponding relationship between signal-to-noise ratios and gain values is shown. The curve in FIG. 8A corresponds to an analog signal comprising white noise with power of −110 dBm, GNSS signal with power of −130 dBm, and two continuous wave components with frequencies of 4 MHz and 400 MHz. The gain G for amplifying the analog signal is gradually adjusted from −50 dB to 10 dB, and the signal-to-noise ratio SNR varies with the adjusted gain value. The optimal gain value is the gain value corresponding to the maximum signal-to-noise ratio. Referring to FIG. 8B, a schematic diagram of a corresponding relationship between entropy values and gain values is shown. The curve in FIG. 8B corresponds to the analog signal comprising two jamming components with frequencies of 4 MHz and 400 MHz. The gain G for amplifying the analog signal is gradually adjusted from −50 dB to 10 dB, and the entropy value varies with the adjusted gain value. The optimal gain value is the gain value corresponding to the maximum entropy value. Comparing the FIG. 8A with FIG. 8B, the optimal gain value corresponding to the maximum signal-to-noise ratio is equal to the optimal gain value corresponding to the maximum entropy value. The optimal gain value determined according to the method 400 therefore generates a digital signal S₃ with a maximum signal-to-noise ratio.

Figure 9A:
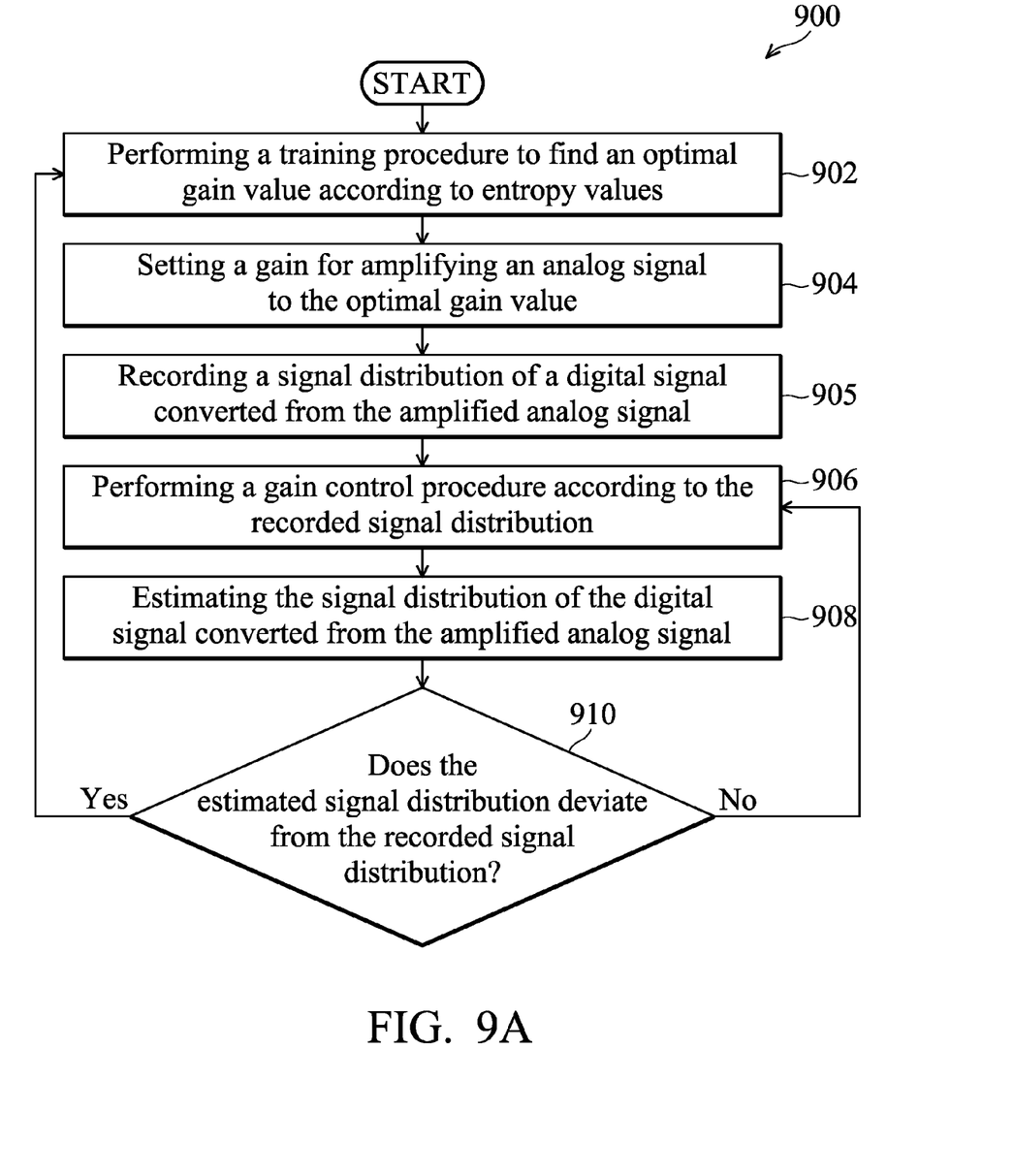
FIG. 9A is a flowchart of an embodiment of a gain control method according to the invention.

Referring to FIG. 9A, a flowchart of an embodiment of a gain control method 900 according to the invention is shown. In the method 900, the method 400 shown in FIG. 4 is referred to as a training procedure, and the method 100 shown in FIG. 1 is referred to as a normal gain control procedure. In other words, the training procedure 400 determines an optimal gain value for amplifying an analog input signal of an analog-to-digital converter according to entropy values of a digital output signal of the analog-to-digital converter. On the contrary, the normal gain control procedure 100 adjusts a gain value for amplifying an analog input signal of an analog-to-digital converter according to an estimation of amplitude or power or signal distribution of a digital output signal of the analog-to-digital converter. The training procedure 400 and the normal gain control 100 can be combined for automatic gain control in the method 900.

In one embodiment, the electronic apparatus 300 further comprises a signal processor (not shown in FIG. 3). For example, the signal processor may be a microcontroller or a digital signal processor. First, the signal processor directs the electronic apparatus 300 to perform a training procedure 400 to find an optimal gain value according to entropy values E (step 902). The gain control module 308 then sets a gain G for amplifying an analog signal $S_1$ to the optimal gain value (step 904). The signal processor then records a first signal distribution of a digital signal $S_3$ converted from the amplified analog signal $S_2$ (step 905). The signal processor then directs the electronic apparatus 300 to perform a normal gain control procedure to precisely adjust the gain G according to the recorded signal distribution (step 906). For example, the automatic gain control algorithm increase or decrease the gain such that the appearance probability of the MSB of the quantized signal is close to a reference value. The signal processor then estimates a second signal distribution of the digital signal $S_3$ again (step 908). The signal processor then compares the first signal distribution obtained at step 905 with the second signal distribution obtained at step 908. If a comparison result indicates that the second signal distribution deviates from the first signal distribution (step 910), which indicates that the input signal model or the environment is different from the previous case, the signal processor directs the electronic apparatus 300 to perform a training procedure again to determine a new optimal gain value (step 902). Otherwise, the signal processor directs the electronic apparatus 300 to perform a normal gain control procedure to precisely adjust the gain G (step 906).

Figure 9B:
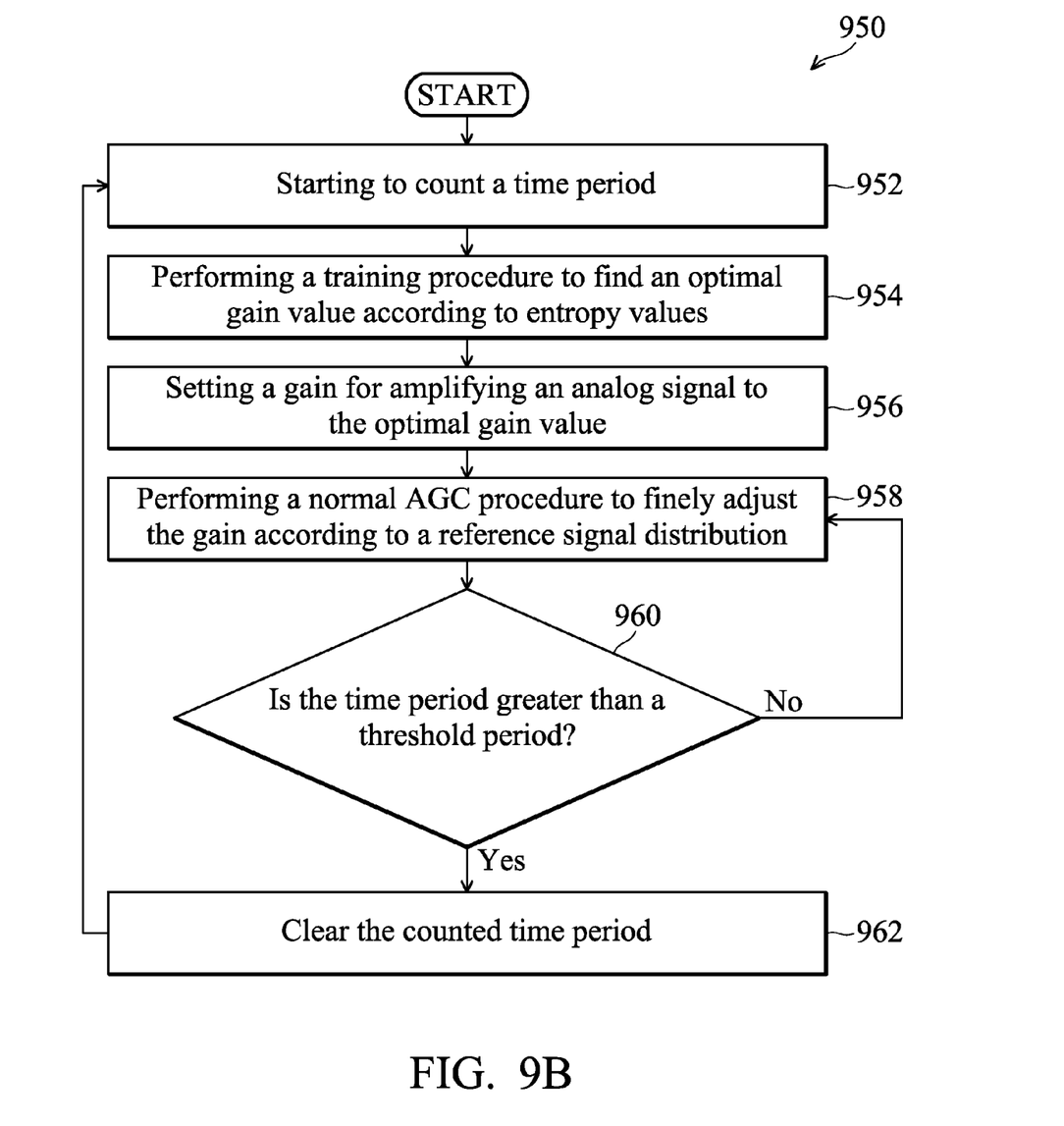
FIG. 9B is a flowchart of another embodiment of a gain control method according to the invention.

Referring to FIG. 9B, a flowchart of another embodiment of a gain control method 950 according to the invention is shown. The training procedure 400 and the normal gain control 100 can also be combined for automatic gain control in the method 950. First, the signal processor starts to count a time period (step 952). The signal processor then directs the electronic apparatus 300 to perform a training procedure 400 to find an optimal gain value according to entropy values E (step 954). The gain control module 308 then sets a gain G for amplifying an analog signal $S_1$ to the optimal gain value (step 956). The signal processor then directs the electronic apparatus 300 to perform a normal gain control procedure to precisely adjust the gain G according to the quantization noise power (step 958). The signal processor then compares the counted time period with a threshold period. When the counted time period is greater than the threshold period (step 960), the signal processor clears the counted time period (step 962), restarts to count the time period (step 952), and then directs the electronic apparatus 300 to perform a training procedure again to determine a new optimal gain value (step 954). Otherwise, the signal processor directs the electronic apparatus 300 to perform a normal gain control procedure to precisely adjust the gain G (step 958).

The invention provides a method for determining an optimal gain for amplifying an input signal of an analog-to-digital converter or a digital-to-digital conversion. The method is suitable to determine gains of analog signals with various jamming components. Because the method determines the optimal gain value according to entropy values which is calculated regardless of a signal distribution module of the analog input signal, the optimal gain value is precisely determined. In addition, a curve of a entropy value has a sharper shape to determine a local maximum in comparison with a curve of a signal-to-noise ratio, improving efficiency for determine the optimal gain value.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A gain control method, wherein an amplifier amplifies a first signal according to a gain to obtain a second signal, and a converter converts the second signal to a digital signal, comprising:

sequentially setting the gain to a plurality of gain values;

calculating a plurality of entropy values of the digital signal corresponding to the gain values;

determining a picked entropy value of the entropy values;

determining the gain value corresponding to the picked entropy value as an picked gain value; and setting the gain to the picked gain value for amplifying the first signal.

2. The gain control method as claimed in claim 1, wherein a maximum entropy value of the entropy values is determined to be the picked entropy value.

3. The gain control method as claimed in claim 1, wherein the first signal and the second signal are analog signals, and the converter converts the second signal from analog to digital to obtain the digital signal.

4. The gain control method as claimed in claim 1, wherein the first signal and the second signal are digital signals, and the converter converts the second signal with a greater bit number to the digital signal with a less bit number.

5. The gain control method as claimed in claim 1, wherein the converter comprises a plurality of steps, and calculation of the entropy values comprises:

counting appearance frequencies of all digital values of the steps of the converter in the digital signal;

summing the appearance frequencies to obtain a total frequency;

dividing the appearance frequencies by the total frequency to obtain appearance probabilities of the digital values in the digital signal; and calculating the entropy value corresponding to one of the gain values according to the appearance probabilities.

6. The gain control method as claimed in claim 5, wherein calculation of the entropy value is according to the following algorithm:

$$E = -\sum_{i=1}^{M} p_i \times \log p_i;$$

wherein E is the entropy value, M is the number of the steps, i is an index of the digital values, and $p_i$ is the appearance probabilities of the digital value corresponding to the ith index.

7. The gain control method as claimed in claim 5, wherein calculation of the entropy value is according to the following algorithm:

$$E = -\frac{1}{1-\alpha} \log \sum_{i=1}^{M} p_i^{\alpha};$$

wherein E is the entropy value, M is the number of the steps, i is an index of the digital values, pi is the appearance probabilities of the digital value corresponding to the ith index, and α is a natural number equal to or greater than 2.

8. The gain control method as claimed in claim 1, wherein a signal distribution of the digital signal is monitored after the gain is set to the picked gain value, and the gain control method is performed again to calibrate the picked gain value for amplifying the first signal when the signal distribution of the digital signal is monitored to have been changed.

9. The gain control method as claimed in claim 1, wherein a count is started for a time period before the gain control method is performed, and the gain control method is performed again to calibrate the gain for amplifying the first signal when the count for the time period is greater than a threshold period.

10. An electronic apparatus, comprising:
an amplifier, for amplifying a first signal according to a gain to obtain a second signal;
a converter, for converting the second signal to a digital signal;
an entropy calculation module, for calculating an entropy value of the digital signal;
a gain control module, for sequentially setting the gain to a plurality of gain values, sequentially recording the entropy values corresponding to the gain values, determining a picked entropy value of the entropy values, determining the gain value corresponding to the picked entropy value as an picked gain value, and setting the gain to the picked gain value for amplifying the first signal.

11. The electronic apparatus as claimed in claim 10, wherein the entropy calculation module is a portion of a processor.

12. The electronic apparatus as claimed in claim 10, wherein the gain control module determines a maximum entropy value of the entropy values to be the picked entropy value.

13. The electronic apparatus as claimed in claim 10, wherein the first signal and the second signal are analog signals, and the converter converts the second signal from analog to digital to obtain the digital signal.

14. The electronic apparatus as claimed in claim 10, wherein the first signal and the second signal are digital signals, and the converter converts the second signal with a greater bit number to the digital signal with a less bit number.

15. The electronic apparatus as claimed in claim 10, wherein the electronic apparatus further comprises a signal processor, for monitoring a signal distribution of the digital signal after the gain control module sets the gain to the picked gain value, and triggering the gain control module to set the gain value again for amplifying the first signal when the signal distribution of the digital signal is monitored to have been changed.

16. The electronic apparatus as claimed in claim 10, wherein the electronic apparatus further comprises a signal processor, for counting a time period before the gain control module sets the gain to a plurality of gain values, and triggering the gain control module to set the gain value again for amplifying the first signal when the count for the time period is greater than a threshold period.

17. The electronic apparatus as claimed in claim 15, wherein the signal processor is a microprocessor or a digital signal processor.

18. A gain control method, wherein an amplifier amplifies a first signal according to a gain to obtain a second signal, and a converter converts the second signal to a digital signal, comprising:
determining a picked gain value for amplifying the first signal according to entropy values of the digital signal;
setting the gain of the amplifier to the picked gain value.

19. The gain control method as claimed in claim 18, wherein the first signal and the second signal are analog signals, and the converter converts the second signal from analog to digital to obtain the digital signal.

20. The gain control method as claimed in claim 18, wherein the first signal and the second signal are digital signals, and the converter converts the second signal with a greater bit number to the digital signal with a less bit number.

21. The gain control method as claimed in claim 18, further comprising:
sequentially setting the gain to a plurality of gain values;
calculating the entropy values of the digital signal corresponding to the gain values;
determining a picked entropy value of the entropy values; and
determining the gain value corresponding to the picked entropy value as the picked gain value.

22. The gain control method as claimed in claim 21, wherein determination of the picked gain value comprises determining a maximum entropy value of the entropy values to be the picked entropy value.

23. The gain control method as claimed in claim 21, wherein the converter comprises a plurality of steps, and calculation of the entropy values comprises:
counting appearance frequencies of digital values of the steps of the converter in the digital signal;
summing the appearance frequencies to obtain a total frequency;
dividing the appearance frequencies by the total frequency to obtain appearance probabilities of the digital values in the digital signal; and
calculating the entropy value corresponding to one of the gain values according to the appearance probabilities.

24. The gain control method as claimed in claim 23, wherein the entropy calculation module calculates the entropy value corresponding to one of the gain values according to the following algorithm:

$$E = -\sum_{i=1}^{M} p_i \times \log p_i;$$

wherein E is the entropy value, M is the number of the steps, i is an index of the digital values, and $p_i$ is the appearance probabilities of the digital value corresponding to the ith index.

25. The gain control method as claimed in claim 23, wherein the entropy calculation module calculates the entropy value corresponding to one of the gain values according to the following algorithm:

$$E = -\frac{1}{1-\alpha} \log \sum_{i=1}^{M} p_i^{\alpha};$$

wherein E is the entropy value, M is the number of the steps, i is an index of the digital values, $p_i$ is the appearance probabilities of the digital value corresponding to the ith index, and α is a natural number equal to or greater than 2.

26. The gain control method as claimed in claim 21, wherein the method further comprises:
counting a time period before setting the gain to a plurality of gain values; and
when the count for the time period is greater than a threshold period, determining the gain value again for amplifying the first signal.

27. The gain control method as claimed in claim 18, further comprising:
changing the gain of the amplifier from an original gain value to an adjusted gain value;
calculating the entropy of the digital signal corresponding to the adjusted gain value;
when the entropy is detected to have been reduced, setting the gain to the adjusted gain value; and
when the entropy is detected to have been increased, setting the gain to the original gain value.

28. The gain control method as claimed in claim 27, wherein calculation of the entropy further comprises:
monitoring a signal distribution of the digital signal; and
calculating the entropy of the digital signal according to the signal distribution.

29. The gain control method as claimed in claim 18, wherein the gain control method further comprises:
after the gain is set to the picked gain value, monitoring a signal distribution of the digital signal; and
when the signal distribution of the digital signal is monitored to have been changed, determining the picked gain value again for amplifying the first signal.

* * * * *